United States Patent
Nakaoka

(10) Patent No.: US 6,785,143 B2
(45) Date of Patent: Aug. 31, 2004

(54) SEMICONDUCTOR MEMORY MODULE

(75) Inventor: Yoshito Nakaoka, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/337,344

(22) Filed: Jan. 7, 2003

(65) Prior Publication Data

US 2004/0017664 A1 Jan. 29, 2004

(30) Foreign Application Priority Data

Jul. 23, 2002 (JP) .................................... 2002-213892

(51) Int. Cl.⁷ .................................................. H05K 7/00
(52) U.S. Cl. .......................... 361/728; 365/53; 257/48
(58) Field of Search ......................... 361/685, 728, 361/764, 803; 257/48, 723, 777; 438/110, 113, 460, 462; 365/53–58

(56) References Cited

U.S. PATENT DOCUMENTS 5,491,360 A * 2/1996 Lin ............................ 257/672
5,508,565 A * 4/1996 Hatakeyama et al. ....... 257/777
5,982,043 A * 11/1999 Iwata ......................... 257/786
6,208,546 B1 * 3/2001 Ikeda ........................... 365/51
6,429,528 B1 * 8/2002 King et al. ................. 257/775
6,531,339 B2 * 3/2003 King et al. ................. 438/110

FOREIGN PATENT DOCUMENTS

JP          01-235264          9/1989

* cited by examiner

*Primary Examiner*—David Martin
*Assistant Examiner*—Thanh S. Phan
(74) *Attorney, Agent, or Firm*—McDermott Will & Emery LLP

(57) ABSTRACT

A bare chip includes a first semiconductor storage part and a second semiconductor storage part, formed in the stage of a wafer serving as a semiconductor material, capable of storing data independently of each other, and an electric wire serving as a semiconductor storage part employment/nonemployment selection circuit setting each of the first semiconductor storage part and the second semiconductor storage part in either a mode capable of inputting/outputting data or a mode incapable of inputting/outputting the data. Thus obtained is a semiconductor memory module formed by a plurality of bare chips integrally coated with molding resin, having a function of replacing a bare chip detected as defective with a spare chip.

3 Claims, 5 Drawing Sheets

SEMICONDUCTOR MEMORY MODULE

BACKGROUND OF THE INVENTION

1. Field of the Invention

The present invention relates to a semiconductor memory module having a plurality of semiconductor chips mounted on a module substrate

2. Description of the Background Art

A method of fabricating a conventional semiconductor chip formed by a bare chip singly coated with molding resin is now described. In the method of fabricating the conventional semiconductor chip, each of bare chips 101 formed as parts of a wafer 140 shown in FIG. 5 is subjected to a probe test (wafer test (WT)) after completion of a wafer process. Among the plurality of bare chips 101, a bit detected as defective as a result of the probe test is replaced with a normally functioning spare bit. Thus, each bare chip 101 is employed as a semiconductor chip normally functioning as a simple substance.

Then, the wafer 140 is diced (cut) along dicing lines 112 shown in FIG. 5, for separating the bare chips 101 from each other. A lead frame is die-bonded (fixed) to each bare chip 101 cut out from the diced wafer 140. As shown in FIG. 6, thin metal bonding wires 105 connect bonding pads 106 of the bare chip 101 and the lead frame with each other. Thereafter the bare chip 101 and the lead frame are molded (sealed) with resin or ceramic.

After the aforementioned assembly step, a final test (FT) represented by an acceleration test or an electrical characteristic test is performed in order to check whether or not each bare chip 101 normally functions. Finally, a QAT (quality assurance test) is performed. Consequently, bare chips 101 having excellent quality are shipped as finished products.

As to the aforementioned semiconductor chip prepared by singly coating the bare chip 101 with molding resin, therefore, the final test can be performed when each semiconductor chip is coated with the molding resin. When a semiconductor memory module is fabricated by mounting a plurality of such semiconductor chips prepared by individually coating the bare chips 101 with molding resin on a module substrate, therefore, the semiconductor memory module can be repaired by replacing only a semiconductor chip detected as defective in the final test with another normally functioning semiconductor chip (The chip functions without any problem in usual use).

When another type of semiconductor memory module is fabricated by mounting the aforementioned plurality of bare chips 101 on a module substrate and integrally sealing the plurality of bare chips 101 with molding resin, for example, and at least a single defective bare chip 101 is detected in a system test performed after integrally sealing the plurality of bare chips 101, however, it is difficult to replace the defective bare chip 101 with another normally functioning bare chip 101, and hence the yield is reduced.

However, the semiconductor memory module fabricated by mounting the plurality of bare chips 101 on the module substrate and integrally sealing the plurality of bare chips 101 is superior to the semiconductor memory module fabricated by mounting the plurality of semiconductor chips prepared by individually coating the bare chips 101 with the molding resin on the module substrate in a point that the mounting area for the bare chips 101 can be reduced.

Therefore, a semiconductor memory module fabricated by mounting a plurality of bare chips 101 on a module substrate and integrally sealing the plurality of bare chips 101 as shown in FIG. 7 desirably includes a spare bare chip with a function of replacing a bare chip 101 detected as defective with the spare bare chip.

SUMMARY OF THE INVENTION

An object of the present invention is to provide a semiconductor memory module, fabricated by integrally sealing a plurality of bare chips, having a function of replacing a bare chip detected as defective with a spare bare chip.

The semiconductor memory module according to the present invention has a plurality of semiconductor chip assemblies, each including a single plate semiconductor material formed by combining a plurality of semiconductor chips with each other, mounted on a module substrate. Each semiconductor chip assembly includes a plurality of semiconductor storage parts provided on the semiconductor material for individually functioning as the said plurality of semiconductor chips and a semiconductor storage part employment/nonemployment selection circuit setting each of the plurality of semiconductor storage parts in either a mode capable of inputting/outputting data or a mode incapable of inputting/outputting the data.

According to the aforementioned structure, a spare semiconductor chip is provided among the plurality of semiconductor chips, so that the semiconductor memory module can exhibit a prescribed function whether or not the plurality of semiconductor chips mounted on the module substrate include a defective semiconductor chip. Therefore, the yield of the semiconductor memory module is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor memory module and a method of fabricating a semiconductor chip employed therefor according to an embodiment of the present invention are now described with reference to FIGS. 1 to 4.

Figure 1:
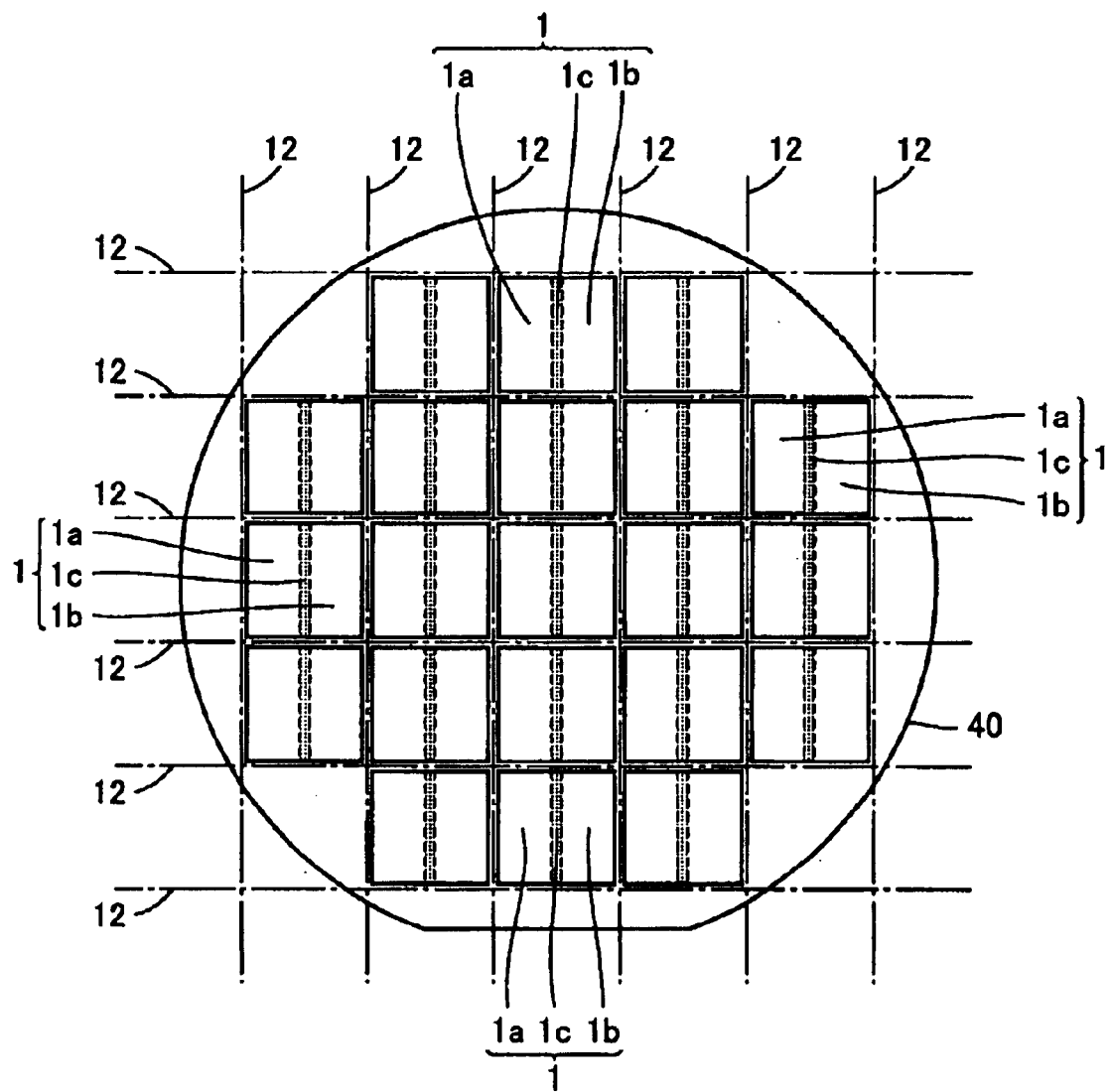
FIG. 1 is a shot layout diagram of a wafer for fabricating bare chips forming a semiconductor memory device according to an embodiment of the present invention with dicing lines for dicing the wafer and cutting out the bare chips and regions provided with activity/inactivity selection circuits.

First, a method of cutting out each bare chip 1 for forming a semiconductor memory device from a semiconductor wafer 40 is describe with reference to FIG. 1.

As shown in FIG. 1, the semiconductor wafer 40 is diced with a generally employed dicing machine, for cutting out each bare chip 1 forming the semiconductor memory device according to this embodiment. Referring to FIG. 1, one-dot chain lines 12 show dicing lines including a plurality of lines transversely extending at intervals similar to those of conventional dicing lines and a plurality of lines vertically extending at intervals twice those of the conventional dicing lines. Each bare chip 1 cut out along such dicing lines has a first semiconductor storage part 1a and a second semiconductor storage part 1b, which are storage areas capable of storing data independently of each other. In other words, each of the first and second semiconductor storage parts 1a and 1b singly functions as a semiconductor chip. Therefore, a semiconductor chip assembly including a plate member formed by the first and second semiconductor storage parts 1a and 1b includes two semiconductor chips singly functioning as semiconductor chips, and is different from a semiconductor chip having a storage area divided into blocks so that the semiconductor chip includes two banks.

Electric wires 15 (15a and 15b) electrically connected with both of the first and second semiconductor storage parts 1a and 1b are provided between the first and second semiconductor storage parts 1a and 1b. Whether or not to employ at least one of the first and second semiconductor storage parts 1a and 1b as a semiconductor memory device can be selected by changing the mode of the electric wires 15, i.e., by disconnecting either one of the electric wires 15 or leaving all of electric wires 15.

The bare chip 1 according to this embodiment allows selection of any of four cases, i.e., a case of employing both of the first and second semiconductor storage parts 1a and 1b, a case of employing only the second semiconductor storage part 1b, a case of employing only the first semiconductor storage part 1a and a case of employing neither the first semiconductor storage part 1a nor the second semiconductor storage part 1b.

Figure 2:
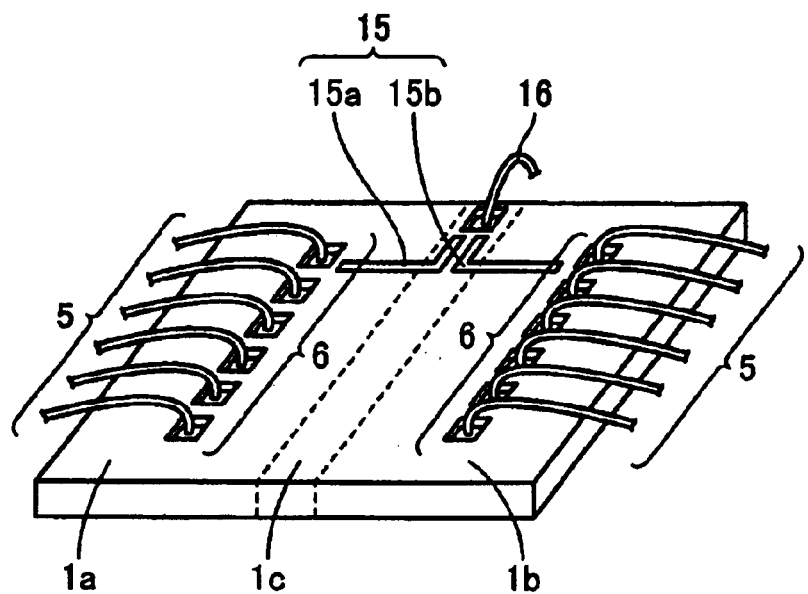
FIG. 2 illustrates an exemplary bare chip forming the semiconductor memory device according to the embodiment.

As shown in FIG. 2 along dicing lines (scribing lines), a region 1c formed with the electric wires 15 is provided between the first and second semiconductor storage parts 1a and 1b. Further, a plurality of bonding pads 6 are provided on the central portion of the main surface of each of the first and second semiconductor storage parts 1a and 1b. Bonding wires 5 are connected to the plurality of bonding pads 6 respectively. These bonding wires 5 are connected to bonding pads provided on a module substrate 2 described later.

Each of the first and second semiconductor storage parts 1a and 1b can singly operate as a semiconductor chip in response to signals input from the bonding pads 6 electrically connected thereto. In other words, all signals necessary for operating a single semiconductor chip are input through the bonding pads 6 electrically connected to the first semiconductor storage part 1a, while all signals necessary for operating a single semiconductor chip are also input through the bonding pads 6 electrically connected to the second semiconductor storage part 1b. In brief, each of the first and second semiconductor storage parts 1a and 1b singly includes the bonding pads 6 capable of receiving all signals required by each of the first and second semiconductor storage parts 1a and 1b for functioning as a single semiconductor chip.

Figure 3:
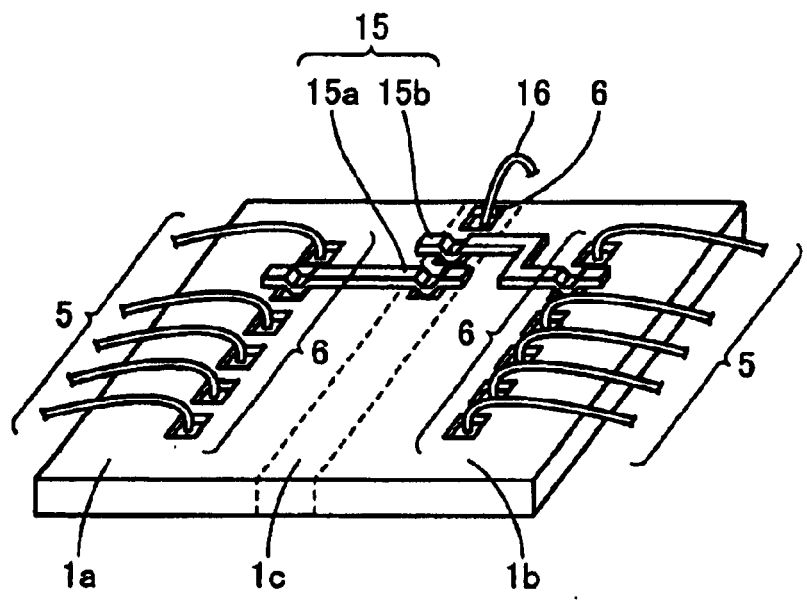
FIG. 3 is a diagram for illustrating another exemplary bare chip forming the semiconductor memory device according to the embodiment.

As shown in FIG. 3, the electric wires 15a and 15b may be thick-film electric wires. Each of the thick-film electric wires 15a and 15b is connected to one of the bonding pads 6 of each of the semiconductor storage parts 1a and 1b. In the region 1c, an electric wire 16 is connected to a bonding pad 6.

Figure 4:
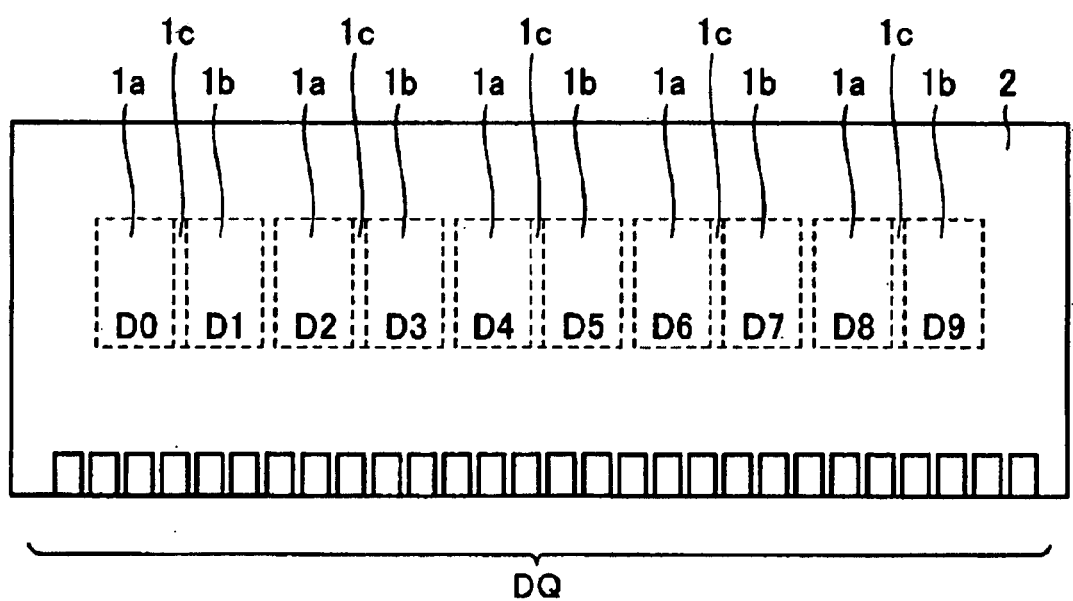
FIG. 4 is a diagram for illustrating the structure of a semiconductor memory module according to the embodiment.

When a plurality of such bare chips 1a according to this embodiment are mounted on the module substrate 2 as shown in FIG. 4, a spare semiconductor storage part 1a or 1b can be provided on the module substrate 2. When the plurality of bare chips 1 mounted on the module substrate 2 are thereafter subjected to a quality test and a defective bare chip 1 is detected, therefore, a spare bare chip 1 (the spare semiconductor storage part 1a or 1b) can substitute for the defective bare chip 1 (the semiconductor storage part 1a or 1b).

Therefore, the semiconductor memory module according to this embodiment shown in FIG. 4 can be subjected to a system test not only after individual inspection of the bare chips 1 but also after mounting the bare chips 1 on the module substrate 2, so that the semiconductor memory module can be repaired with the spare bare chip 1 when a defective bare chip 1 is detected.

As shown in FIG. 1, the electric wires 15a and 15b serving as semiconductor storage part selection circuits are provided on positions for dicing the semiconductor wafer 40 in general employment. Therefore, the semiconductor memory module according to this embodiment can be fabricated without complicating a conventional dicing method.

The structure and effects of the semiconductor memory module according to this embodiment are now summarized.

The semiconductor memory module according to this embodiment is formed by mounting a plurality of bare chips 1 each serving as a semiconductor chip assembly including a plate semiconductor material prepared by combining a plurality of semiconductor chips with each other on the module substrate 2.

Each bare chip 1 includes the first and second semiconductor storage parts 1a and 1b formed in the state of the wafer 40 serving as a semiconductor material for singly functioning as semiconductor chips respectively and the electric wires 15 each serving as a semiconductor storage part employment/nonemployment selection circuit setting each of the first and second semiconductor storage parts 1a and 1b in either a mode capable of inputting/outputting data or a mode incapable of inputting/outputting data.

According to the aforementioned structure, the spare bare chip 1 is provided among the plurality of bare chips 1, to attain the following effects:

In the stage of the semiconductor memory module obtained by mounting the plurality of bare chips 1 including the spare bare chip 1 on the module substrate 2, each of the plurality of bare chips 1 including the spare bare chip 1 is in a mode capable of inputting/outputting data. In this state, therefore, the semiconductor memory module cannot exhibit a proper function.

Therefore, the spare bare chip 1 included in the plurality of bare chips 1 must be set in a mode incapable of inputting/outputting data. In a step of fabricating the semiconductor memory module, a system test must be performed for checking whether or not each of the plurality of bare chips 1 properly functions after mounting the plurality of bare chips 1 on the module substrate 2.

If no defective bare chip 1 is detected among the plurality of bare chips 1 in the aforementioned system test on the semiconductor memory module according to this embodiment, the spare semiconductor storage part 1a or 1b can be brought into an unused state through the aforementioned electric wire 15a or 15b serving as a semiconductor storage part employment/nonemployment selection circuit.

When a defective bare chip 1 (semiconductor storage part 1a or 1b) is detected among the plurality of bare chips 1, the defective bare chip 1 (semiconductor storage part 1a or 1b) can be brought into an unused state incapable of inputting/outputting data through the aforementioned electric wire 15a or 15b while keeping the spare semiconductor storage part 1a or 1b in a used state capable of inputting/outputting data.

Consequently, the semiconductor memory module can exhibit a prescribed function whether or not the plurality of bare chips 1 mounted on the module substrate 2 include a defective bare chip 1. Thus, the yield of the semiconductor memory module is improved.

The electric wires 15a and 15b serving as semiconductor storage part employment/nonemployment selection circuits are provided on the region 1c between the semiconductor storage parts 1a and 1b. Therefore, the space of the wafer 40 serving as the semiconductor material can be effectively utilized.

The electric wires 15 include the electric wires 15a and 15b electrically connected to the first and second semiconductor storage parts 1a and 1b respectively, so that the first and second semiconductor storage parts 1a and 1b enter the mode incapable of inputting/outputting data when the electric wires 15a and 15b are disconnected. Therefore, used and unused states of the bare chip 1 can be selected by simply disconnecting at least one of the electric wires 15a and 15b.

Figure 5:
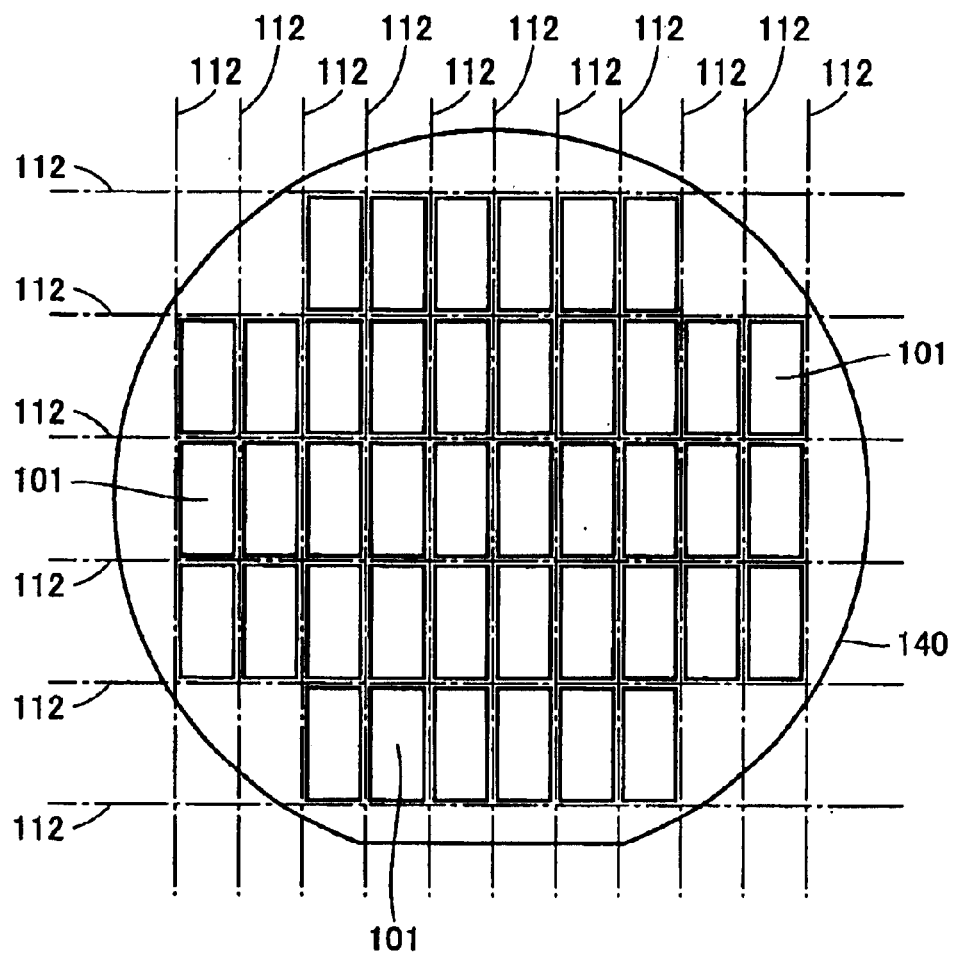
FIG. 5 illustrates dicing lines in a wafer for fabricating bare chips forming a conventional semiconductor memory device.
Figure 6:
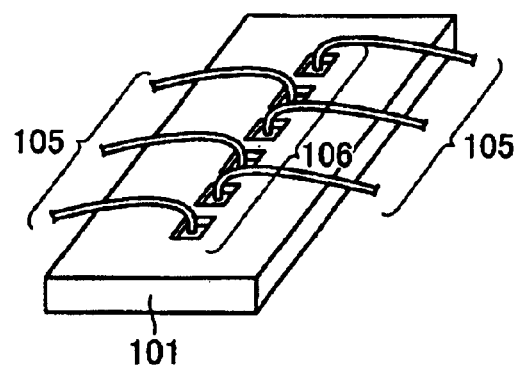
FIG. 6 is a diagram for illustrating a bare chip cut out from the wafer by dicing.
Figure 7:
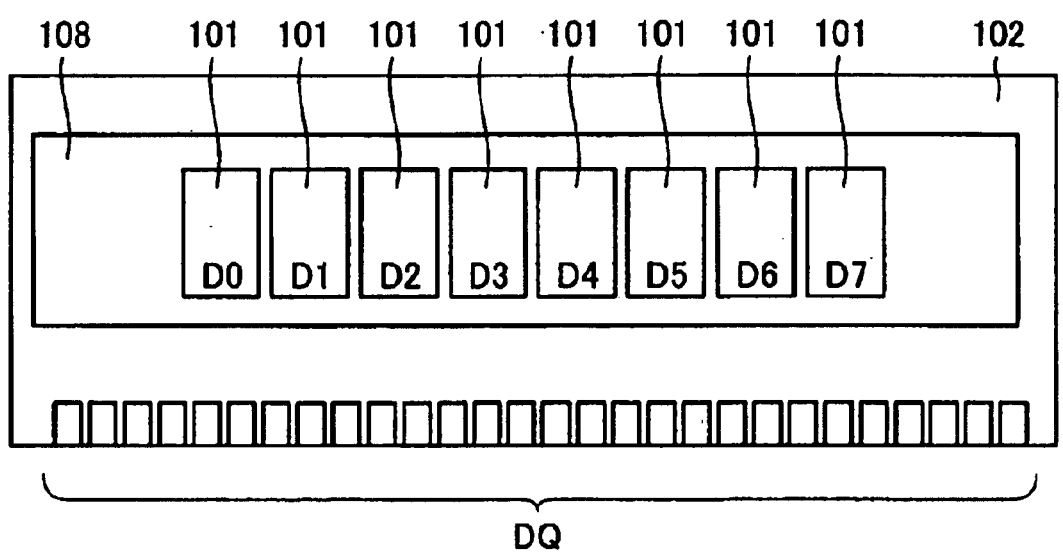
FIG. 7 illustrates the layout of bare chips in a conventional semiconductor memory module.

In the semiconductor memory module according to this embodiment, the semiconductor storage part employment/nonemployment selection circuits are mounted on unused dicing lines of a conventional product without changing the shot layout of the conventional product shown in FIG. 5, whereby the aforementioned effects can be attained while partially utilizing the mode of the conventional product and a conventional dicing technique.

A method of fabricating the bare chip 1 according to this embodiment includes steps of forming a single wafer 40, forming the first and second semiconductor storage parts 1a and 1b capable of storing data independently of each other while forming a dicing region 1c having a width substantially equivalent to the width of the blade of a dicing machine between the first and second semiconductor storage parts 1a and 1b and dicing the wafer 40 along the dicing line 12 for separating each of a plurality of units constituted with a unit including the first and second semiconductor storage parts 1a and 1b from wafer 40.

The method of fabricating the bare chip 1 according to this embodiment includes a step of forming the electric wires 15a and 15b each serving as a semiconductor storage part employment/nonemployment selection circuit capable of setting each of the first and second semiconductor storage parts 1a and 1b in either a mode capable of inputting/outputting data or a mode incapable of inputting/outputting data on each region 1c between the first and second semiconductor storage parts 1a and 1b. The method also includes a step of dicing the wafer 40 along the dicing line 12 for separating each of a plurality of units constituted with a unit including the first and second semiconductor storage parts 1a and 1b from wafer 40.

According to the aforementioned method, the wafer 40 can be diced by the existing dicing method, while the electric wires 15a and 15b can be effectively provided on a region not subjected to dicing.

In the method of fabricating the bare chip 1 according to this embodiment, the electric wires 15a and 15b are electrically connected to the first and second semiconductor storage parts 1a and 1b in the stage partially forming the single semiconductor wafer 40 respectively.

According to the aforementioned method, the electric wires 15a and 15b can be more readily electrically connected to the first and second semiconductor storage parts 1a and 1b respectively.

While the semiconductor memory module according to this embodiment has been described with reference to the semiconductor chip having two semiconductor storage parts, i.e., the first and second semiconductor storage parts 1a and 1b, the number of the semiconductor storage parts is not restricted to two so far as disconnectable electric wires are connected to the semiconductor storage parts respectively.

Further, the semiconductor storage part employment/nonemployment selection circuits, described with reference to the electric wires 15a and 15b, may alternatively be formed by other circuits so far as each of the circuits can switch any of a plurality of semiconductor storage parts or each an arbitrary combination of semiconductor storage parts between a usable state and an unusable state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory module having a plurality of semiconductor chip assemblies mounted on a module substrate, wherein
   each said semiconductor chip assembly includes:
   a plurality of semiconductor storage parts each capable of storing data, the plurality of semiconductor storage parts having been formed side-by-side on a common wafer and then separated therefrom to form a single chip, and
   a semiconductor storage part employment/nonemployment selection circuit for setting each of said plurality of semiconductor storage parts in either a mode capable of inputting/outputting data or a mode incapable of inputting/outputting said data wherein
   said semiconductor storage part employment/nonemployment selection circuit is provided on a region between said semiconductor storage parts.

2. A semiconductor memory module having a plurality of semiconductor chip assemblies mounted on a module substrate, wherein
   each said semiconductor chip assembly includes:
   a plurality of semiconductor storage parts each capable of storing data, the plurality of semiconductor storage parts having been formed side-by-side on a common wafer and then separated therefrom to form a single chip, and
   a semiconductor storage part employment/nonemployment selection circuit for setting each of said plurality of semiconductor storage parts in either a mode capable of inputting/outputting data or a mode incapable of inputting/outputting said data, wherein
   said semiconductor storage part employment/nonemployment selection circuit includes an electric wire electrically connected to said plurality of semiconductor storage parts respectively for setting each of said plurality of semiconductor storage parts in said mode incapable of inputting/outputting said data by disconnecting said electric wire.

3. The semiconductor memory module according to claim 2, wherein said electric wire is provided on said chip.

* * * * *